United States Patent [19]

Ishizaki et al.

[11] 4,434,441
[45] Feb. 28, 1984

[54] METHOD FOR DRIVING A CHARGE INJECTION DEVICE

[75] Inventors: Hiroyuki Ishizaki, Akashi; Yoshiki Tsujino, Kakogawa; Masaji Dohi, Kobe, all of Japan

[73] Assignee: Fujitsu Limited, Kawasaki, Japan

[21] Appl. No.: 324,070

[22] Filed: Nov. 23, 1981

[30] Foreign Application Priority Data

Nov. 27, 1980 [JP] Japan .................................. 55-167828

[51] Int. Cl.³ ............................................. H04N 3/14
[52] U.S. Cl. ................................................ 358/213
[58] Field of Search .......................................... 358/213

[56] References Cited

U.S. PATENT DOCUMENTS

| | | |
|---|---|---|
| 3,801,820 | 4/1974 | Eichelberger et al. ............. 250/211 |
| 3,882,531 | 5/1975 | Michon et al. ........................ 357/24 |
| 4,322,753 | 3/1982 | Ishihara ................................ 358/213 |

*Primary Examiner*—Richard Murray
*Attorney, Agent, or Firm*—Daniel J. Tick

[57] ABSTRACT

A charge injection device sensing an optical radiation pattern is driven at an operation sequence where the charge holding mode is inserted between the charge storing/readout mode and the charge injection mode. The charge holding period is effective for picture elements influenced by charges injected into the substrate after the readout operation placed spacially far and timed. The problem of cross-talk at high speed operation is resolved.

6 Claims, 4 Drawing Figures

METHOD FOR DRIVING A CHARGE INJECTION DEVICE

BACKGROUND OF THE INVENTION

1. Field of the Invention

The present invention relates to a method for driving a charge injection device. More particularly, the invention relates to an improved method for driving a charge injection device, hereinafter referred to as a CID, which is used as an image sensing device for bi-dimensional images.

2. Description of Prior Arts

A CID is known as a solid state imaging device which reads out corresponding electrical image signals by sensing the optical radiation pattern.

A known CID has, in general, picture elements, each of which is composed of a pair of insulating electrodes, arranged bi-dimensionally on the semiconductor substrate which is covered with insulating film at the surface. Corresponding electrodes of each row are connected in common to vertical X buses and other corresponding electrodes of each column are connected in common to the horizontal Y buses. When an optical image is projected onto the sensing surface of the matrix under the condition that a voltage of about 10 V is applied to the one electrode 2X of picture elements and a voltage of about 20 V to the other electrode, the charges 4 in the semiconductor substrate generated by the optical activation are stored in the potential well 3b formed just under the electrode 2Y. Thereafter, said charges 4 are shifted at a time for each picture element to the well 3a just under the adjacent electrode 2X in such a timing that the wells just under the electrode 2Y connected to the selected Y bus are disappeared at a time by the voltage operation from the shift register 20 in the vertical direction. The condition during such process can be seen in the picture element group of 3rd stage in FIG. 1. The image charge is generated on the electrode 2X at the moment where such charge 4 is shifted, and said image charge is sequentially read out to the output terminal of the charge sensitive amplifier 7 via the electronic switches 11, 12, 13, 14. Here, 10 is the horizontal shift register; 9 is the reset switch which applies a voltage $V_S$ to the electrode 2X of each picture element; $X_1$ to $X_4$, $Y_1$ to $Y_4$ are X bus group and Y bus group, respectively.

When readout for one frame of said CID completes, the well to which the charges generated by optical activation are shifted can be made to disappear by turning ON the electronic switches, whereby the charges are injected into the substrate and disappear therein. The succeeding charges generated by optical activation are then stored in the well newly formed just under the other electrode preparing for the image sensing of the next single frame.

Here, the other electrode has the function of storing signal charges, so it is called the storing electrode, while the adjacent electrode has the function of detecting signal charges, so it is called the detecting electrode.

The peripheral circuits as well as the charge sensitive amplifier of the aforementioned CID may be integrated on the same substrate. However, the upper limit of frequency response of the charge sensitive amplifier is usually set to a frequency as low as 1 MHz, which means that it is difficult to read out the signal within a period shorter than one microsecond. It is therefore impossible to use a high speed drive having the afore-described known structure for a CID where a plurality of picture elements are arranged with high density.

In order to solve such problem, it is sufficient to sequentially read out in parallel all signals, in the sequence of columns, for example, sent from the picture elements arranged in a line in the vertical direction. However, it is always very difficult to inject all picture element charges into the substrate after completing parallel readout in the sequence of columns and store the optically activated charges by immediately preparing new wells. In other words, if the lifetime of charges injected into the substrate is comparatively long such as, for example, one microsecond, if the next storing operation is started while the charges injected first into the substrate have not yet disappeared and remain, such remaining charges partly enter the newly formed well drastically degrading the readout image. The partial entering of the remaining charges into the new formed well is known as the cross-talk phenomenon.

In order to solve such cross-talk problem, sufficient idle time may be prepared for the disappearance of injected charges after the stored charges of all the picture elements are injected into the substrate. This prevents the cross-talk perfectly, but results in the frame time becoming long due to the setting of idle time, thus making the realization of high speed operation difficult.

The principal object of the invention is to provide a method for driving a CID which solves the abovementioned problem caused by the injected charges.

An object of the invention is to provide a method for driving a CID which successfully solves the problem of residual image and deterioration of resolution resulting from the injected charges.

Another object of the invention is to provide a method for driving a CID which realizes high speed sequential readout without any cross-talk.

Still another object of the invention is to provide a high speed driving method for a CID which assures high quality image signals.

SUMMARY OF THE INVENTION

In the method of the invention, the basic operation sequence, essentially including the operations of charge storing, readout and injection, is repeated for each picture element considered as the readout unit and the specified charge holding period is set between the readout period and injection period. This results in the realization of the drive for a charge injection device without permitting the frame time to become long and preventing cross-talk phenomenon.

BRIEF DESCRIPTION OF THE DRAWINGS

In order that the invention may be readily carried into effect, it will now be described with reference to the accompanying drawings, wherein.

DETAILED DESCRIPTION OF THE PREFERRED EMBODIMENT

Figure 1:
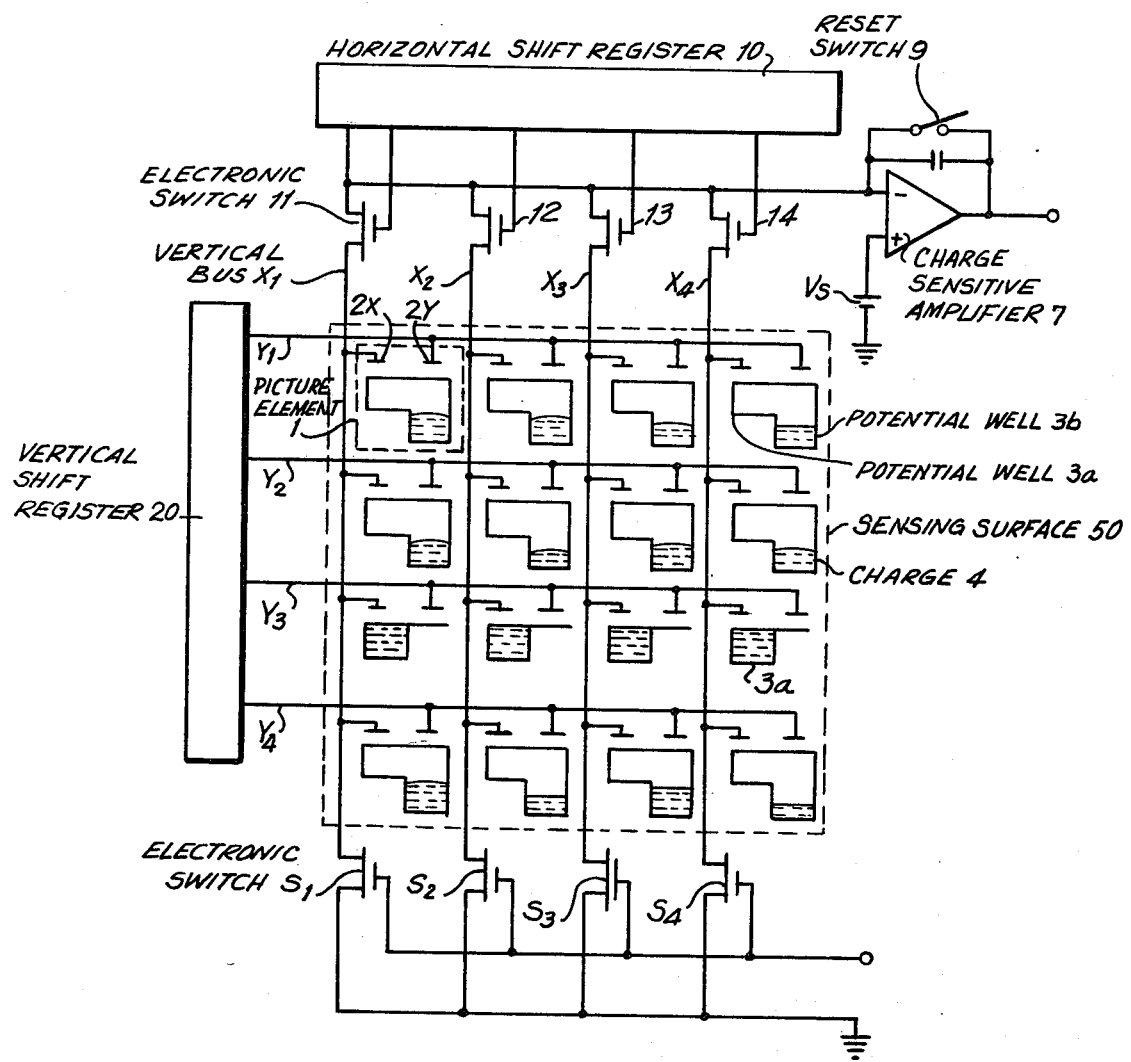
FIG. 1 is a block diagram of a CID of the prior art.

The known CID of FIG. 1 has, in general, picture elements 1, each of which is composed of a pair of insulating electrodes 2X and 2Y, arranged bi-dimensionally on the semiconductor substrate which is covered with insulating film at the surface. The corresponding one of the electrodes 2X of each row are connected in common to vertical X buses $X_1$ to $X_4$ and the other correspondingelectrodes 2Y of each column are connected in common to the horizontal Y buses $Y_1$ to $Y_4$. When an optical image is projected onto the sensing surface 50 of the matrix under the condition that a voltage of about 10 V is applied to the one electrode 2X of the picture elements and a voltage of about 20 V is applied to the other electrode 2Y, the charges 4 in the semiconductor substrate generated by the optical activation are stored in the potential well $3b$ formed just under the electrode 2Y. Thereafter, the charges 4 are shifted at a time for each picture element to the potential well $3a$ just under the adjacent electrode 2X with such timing that the wells just under the electrode 2Y connected to the selected Y bus disappear at a time due to voltage operation from a shift register 20 in the vertical direction. The condition during such process is shown in the picture element group of the third stage of FIG. 1. The image charge is generated on the adjacent electrode 2X at the moment that the charge 4 is shifted, and said image charge is sequentially read out to the output terminal of a charge sensitive amplifier 7 via electronic switches 11, 12, 13 and 14. Also provided are a horizontal shift register 10 and a reset switch which applies a voltage $V_S$ to the electrode 2X of each picture element. The X bus group includes $X_1$ to $X_4$ and the Y bus group includes $Y_1$ to $Y_4$.

When readout is completed for one frame of the CID, the well $3a$ to which the charges generated by optical activation are shifted can be made to disappear by turning ON the electronic switches $S_1$ to $S_4$, whereby the charges are injected into the substrate and disappear therein. The succeeding charges generated by optical activation are then stored in the well newly formed just under the electrode 2Y preparing for the image sensing of the next single frame.

Here, the insulated electrode 2Y has the function of storing signal charges, so it is called the storing electrode, while the electrode 2X has the function of detecting signal charges, so it is called the detecting electrode.

The peripheral circuits as well as the charge sensitive amplifier 7 of the aforedescribed CID may be integrated on the same substrate. However, the upper limit of frequency response of the charge sensitive amplifier 7 is usually set to a frequency as low as 1 MHz, which means that it is difficult to read out the signal within a period shorter than one microsecond. It is therefore impossible to use a high speed drive having the aforedescribed known structure, shown in FIG. 1, for a CID where a plurality of picture elements are arranged with high density.

Figure 2:
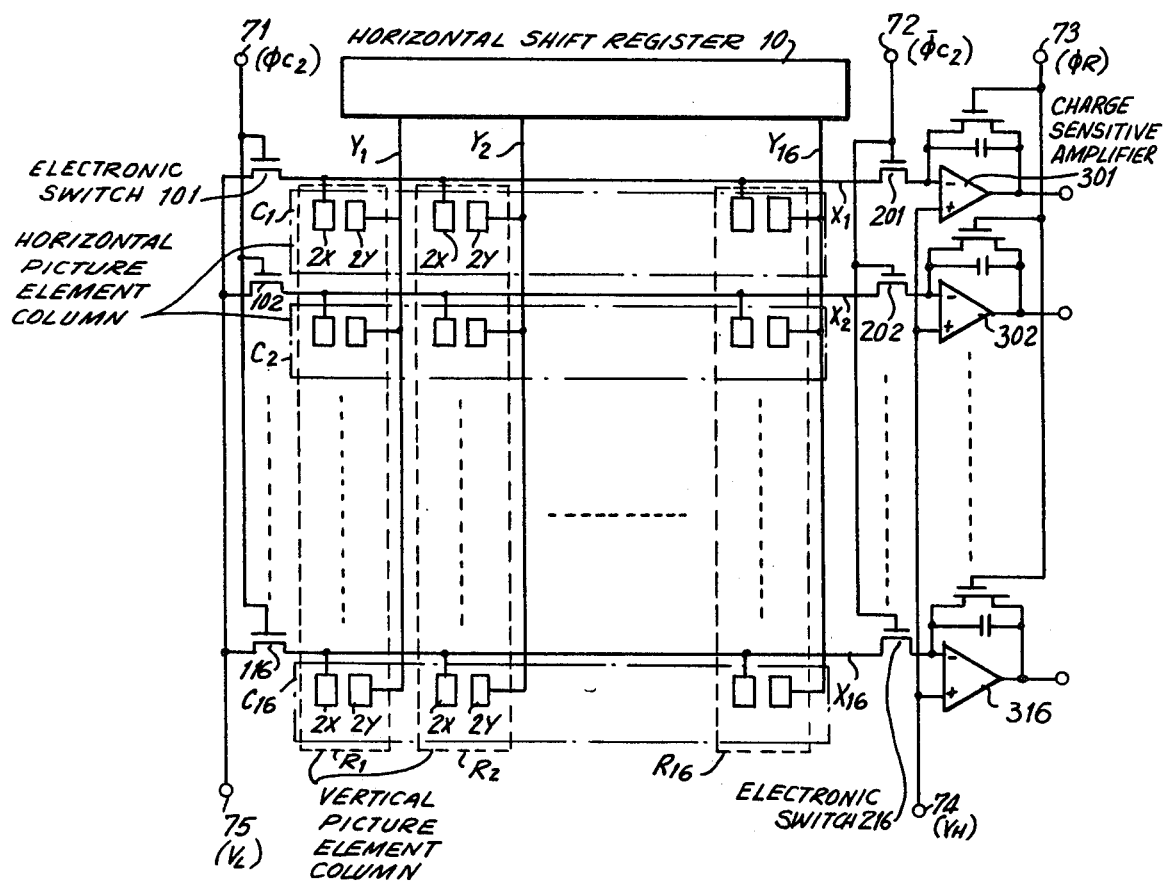
FIG. 2 is a block diagram of a preferred embodiment of the parallel readout type CID of the invention.

FIG. 2 shows a preferred embodiment of the CID of the invention, of $16 \times 16$ picture element parallel readout type where the charge sensitive amplifiers 301 to 316 are connected to the horizontal buses $X_1$ to $X_{16}$, respectively, in view of realizing high speed readout operation. In the parallel readout operation, the picture element group of vertical one column, enclosed by the broken line in FIG. 2, is called the vertical picture element column $R_1$ to $R_{16}$, while the picture element group enclosed by the broken line for horizontal one column is called the horizontal picture element column $C_1$ to $C_{16}$.

A vertical shift register is not included in the parallel readout type CID having the circuit shown in FIG. 2. However, a first group of electronic switches 101 to 116 and a second group of electronic switches 201 to 216 are provided instead of such shift register. In addition, the pulse $\phi c_2$ is applied to the common gate terminal 71 of the first group of electronic switches and on the other hand, the pulse $\overline{\phi c_2}$, which is the reverse phase pulse of $\phi c_2$ is applied to the common gate terminal 72 of the second group of electronic switches. Additionally, the power source $V_H$ for biasing the detecting electrode 2X is connected to the terminal 74 via a charge sensitive amplifier. When the pulse $\overline{\phi c_2}$ becomes high level H, the pulse $\phi c_2$ simultaneously becomes low level L. Therefore, the high level voltage $V_H$ supplied via the terminal 74 biases the detecting electrode 2X of each picture element via the input terminals of the charge sensitive amplifiers 301 to 316 and the electronic switches 201 to 216 in the ON condition and the comparatively shallow well is formed thereunder. On the contrary, when the pulse $\phi c_2$ becomes high level H and the pulse $\overline{\phi c_2}$ becomes L level, the electronic switches 101 to 116 become ON, while the electronic switches 201 to 216 become OFF. As a result, the horizontal buses $X_1$ to $X_{16}$ are disconnected from the charge sensitive amplifiers 301 to 316, and are simultaneously connected, in turn, to a low level (or ground potential) of the terminal 75. Therefore, the detecting electrode 2X is biased to a low level voltage and the well just under the electrode 2X disappears.

On the other hand, the drive voltage having the predetermined waveform is sequentially applied selectively to the storing electrode 2Y in the vertical picture element columns $R_1$ to $R_{16}$ toward the direction of the buses $Y_1$ to $Y_{16}$ via the vertical buses $Y_1$ to $Y_{16}$ from the shift register 10 in such a manner that the storing period and readout period, charge sustaining period and injection period are set as hereinafter explained. In this case, the deep well formed previously just under the storing electrode 2Y disappears once in the readout period, the signal charges generated therein are shifted to the shallow well formed just under the detecting electrode 2X said signal charges are read by the charge sensitive amplifiers 301 to 316 via the horizontal buses $X_1$ to $X_{16}$ and the electronic switches 201 to 216 which are turned ON, and said signal charges are output in parallel at the output terminal of each charge sensitive amplifier.

Figure 3:
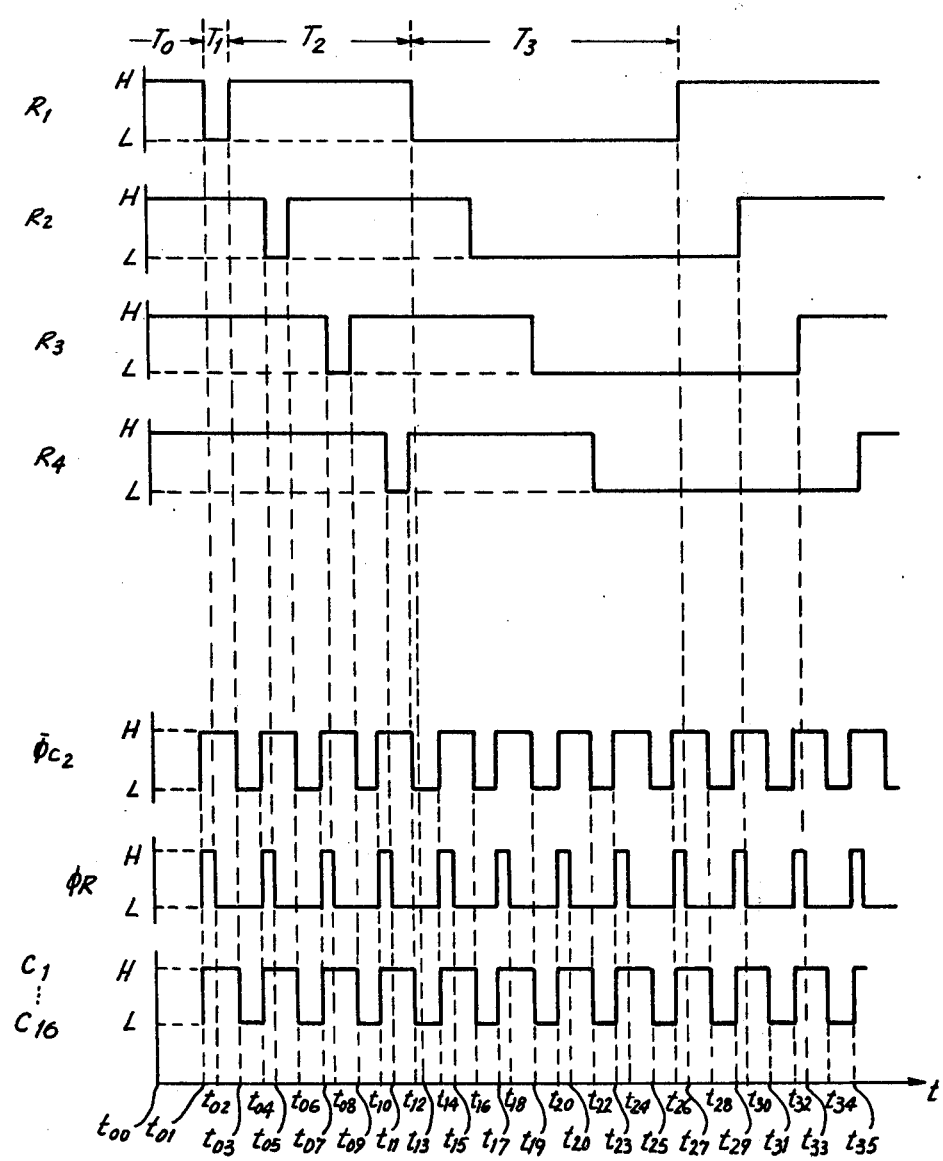
FIG. 3 is the principal part of a time chart explaining the method for driving a CID of the invention.

FIG. 3 shows an enlarged part of the signal charge readout time chart of the CID of FIG. 2. The operation mode of the vertical picture element columns $R_1$, $R_2$, $R_3$, $R_4$, . . . is the operation sequence composed of the charge storing period $T_0$, readout period $T_1$, charge holding period $T_2$, injection period $T_3$. More particularly, the storing electrode 2Y of the first picture element column $R_1$ is set to the high level potential H and operates in the storing mode during the period from $t_{00}$ to $t_{02}$, set to the low level potential L, and transfers the signal charge to the well at the side of the detecting electrode 2X. Its resultant readout, during the period from $t_{02}$ to $t_{03}$, is set to the high level H again and again fetches the signal charges and sustains them during the period from $t_{03}$ to $t_{13}$, and finally sets the gain to the low levelL and injects the charges into the substrate during the period from $t_{13}$ to $t_{27}$. Both high and low levels of each voltage waveform shown in FIG. 3 as $R_1$ to $R_4$ show the levels of voltages applied sequentially to the storing electrode 2Y of the corresponding vertical picture element comumns from the shift register 10.

The first vertical picture element column $R_1$ is now considered. A high level H voltage is applied to the detecting electrode 2X of the horizontal picture element columns $C_1$ to $C_{16}$ from the terminal 74, as shown in $C_1$ to $C_{16}$ of FIG. 3 at the time $t_{01}$ just before the voltage to the storing electrode 2Y drops to the low level L. The shallow well is thereby formed just under the detecting electrode 2X, waiting to transfer charges from the deep well formed just under the storing electrode 2Y. If the voltage of the storing electrode 2Y of the vertical picture element column $R_1$ drops to the low level L at the time $t_{02}$ and the well just under said storing electrode disappears, the shallow well just under the detecting electrode 2X of the pertinent picture element column receives the signal charges from the deep well. However, since the image charges are generated on the detecting electrode, said image charges are detected by the charge sensitive amplifier, thus completing the readout operation.

Succeedingly, the voltage of the storing electrode 2Y of the vertical picture element column $R_1$ comes to the H level again in the charge holding period from $t_{03}$ to $t_{13}$ and the charges which are once transferred to the detecting electrode 2X are returned again to the well formed under the pertinent storing electrode 2Y, setting the holding condition. The reason why the holding period is provided in this case is hereinafter explained. However, during this charge holding period, since the well is formed just under the storing electrode 2Y, the charges generated by the incident light are stored, but these stored charges are not read out as the signal charges and are injected into the substrate in the injection period from $t_{13}$ to $t_{27}$ and disappears.

The vertical picture element column $R_2$ is provided with the same operation sequence as explained, with a time difference of $t_{05}-t_{02}$ and the vertical picture element column $R_3$ is also provided with the same operation sequence with a further time difference of $t_{08}-t_{05}$. In the same way, the succeeding vertical picture element columns $R_4$, $R_5$, $R_6$, $R_7$, . . . are operated with the same time difference and the same operation sequence as explained. In FIG. 3, the signal indicated by $\overline{\phi}c_2$ is the waveform for the ON and OFF control of the electronic switches 201 to 216, corresponding to the aforementioned voltage waveforms $C_1$ to $C_{16}$ applied to the detecting electrode 2X of each horizontal picture element column. In FIG. 3, the signal indicated by $\phi_R$ is the waveform of the reset pulse for the charge sensitive amplifiers 301 to 316. This signal is changed to high and low levels a little more rapidly than the aforementioned readout start time of the vertical picture element columns because the charge sensitive amplifiers discharge the charges previously stored in the feedback capacitance of said amplifiers before said amplifiers connected to the horizontal picture element columns detect the image charges. In FIG. 3, where the time t is plotted on the horizontal axis, voltage applied to the horizontal picture element columns $C_1$ to $C_{16}$ are often switched to high and low levels corresponding to $\overline{\phi}c_2$. Thus, when the vertical picture element column $R_1$ enters the injection mode, for example, at the time $t=t_{13}$, the well is formed just under the detecting electrode 2X if the voltage of said detecting electrode of the horizontal picture element columns $C_1$ to $C_{16}$ is at the high level, and therefore no charge is injected into the substrate. This phenomenon is also true to the other vertical picture element columns $R_2$, $R_3$, $R_4$, . . . . Thus, as shown in FIG. 3, the well is not formed just under the detecting electrode 2X when the voltage of said detecting electrode of the horizontal picture element columns $C_1$ to $C_{16}$ at the time $t=t_{12}$, a little before the time $t=t_{13}$, is set at the low level and as a result the used charges can be injected into the substrate as required. This reason also causes the voltage of the detecting electrode 2X of the horizontal picture element columns $C_1$ to $C_{16}$ at the times $t=t_{16}$, $t=t_{19}$ and $t=t_{22}$ to the change to low level. In other words, the vertical picture element column $R_1$ carries out actual charge injection in each period $t_{12}$ to $t_{14}$, $t_{16}$ to $t_{17}$, $t_{19}$ to $t_{20}$, $t_{22}$ to $t_{23}$, $t_{25}$ to $t_{26}$ and the vertical picture element $R_2$ in each period $t_{16}$ to $t_{17}$, $t_{19}$ to $t_{20}$, $t_{22}$ to $t_{23}$, $t_{25}$ to $t_{26}$, $t_{28}$ to $t_{29}$, the vertical picture element column $R_3$ in each period $t_{19}$ to $t_{20}$, $t_{22}$ to $t_{23}$, $t_{25}$ to $t_{26}$, $t_{28}$ to $t_{29}$, $t_{31}$ to $t_{32}$ and the vertical picture element column $R_4$ in each period $t_{22}$ to $t_{23}$, $t_{25}$ to $t_{26}$, $t_{28}$ to $t_{29}$, $t_{31}$ to $t_{32}$, $t_{34}$ to $t_{35}$.

Figure 4:
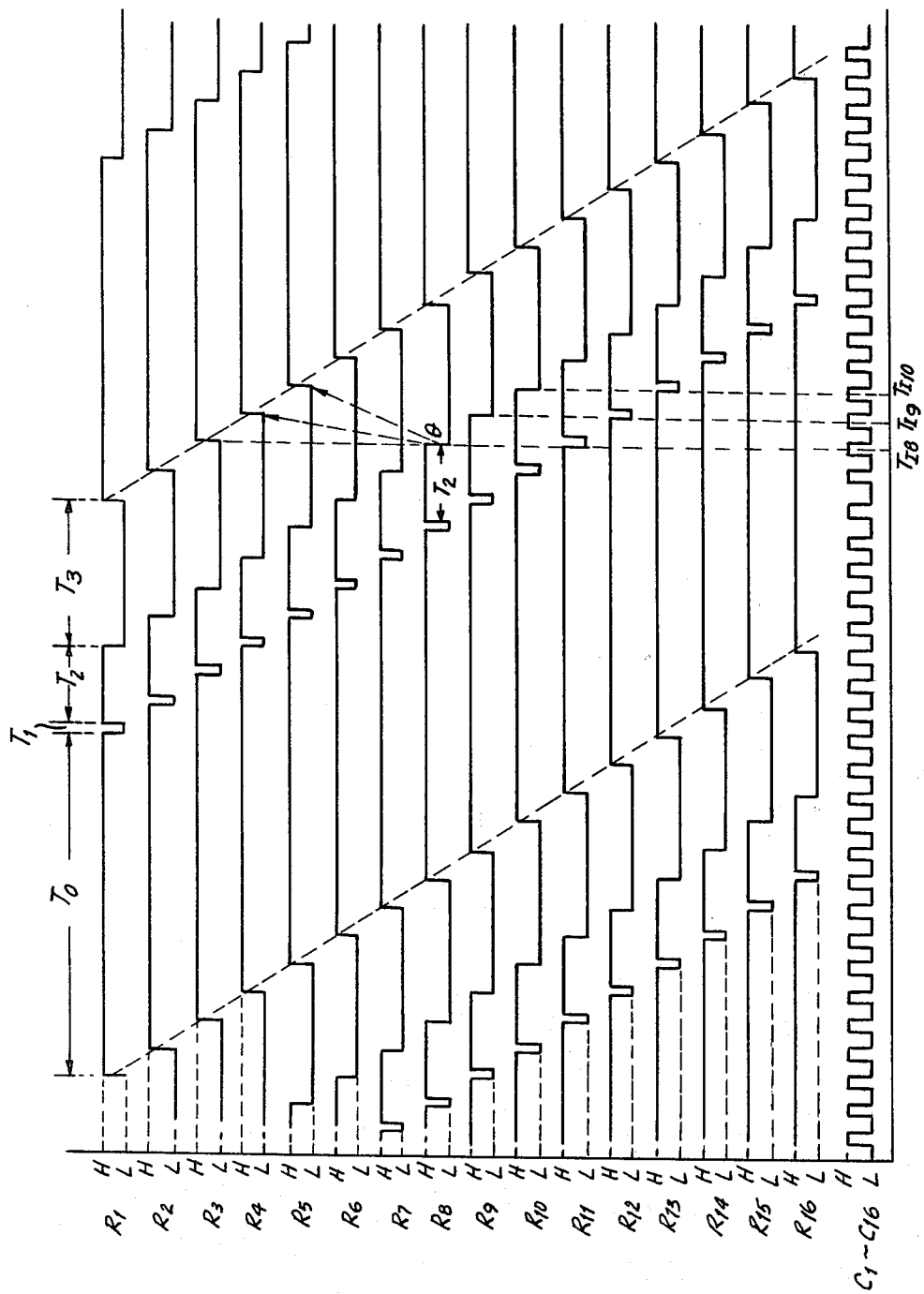
FIG. 4 is the entire time chart explaining the CID drive method of the invention.

FIG. 4 shows the entire part of the time chart of the CID drive of the invention, and the same portions as shown in FIG. 3 are identified by the same symbols.

The reason for providing the charge holding time $T_2$ in the CID of the invention is explained with reference to the time chart of FIG. 4. Here, attention is focused on the point Q of the 8th vertical picture element column $R_8$ in FIG. 4 where it comes to the low level at the time $t=T_{I8}$ and carries out charge injection. The 8th picture element column $R_8$ carries out charge injection to the substrate at the time $T_{I8}$ and injected charges enter the well if the well is formed in the periphery of the 8th picture element column.

However, the 7th picture element column $R_7$, which is nearest to the picture element column $R_8$, the next nearest 6th picture element, and the 5th and 4th picture element columns $R_5$ and $R_4$, respectively at the low level at the charge injection time $T_{I8}$. More particularly, no well is formed under the storing electrodes of the vertical picture element columns from the 7th to the 4th columns so that cross-talk does not occur in said picture element column group.

Since the voltage of the storing electrode of the third picture element column $R_3$ comes to the high level at the time $T_{I8}$ and the voltage of the storing electrodes of the second and first picture element columns $R_2$ and $R_1$, respectively, are switched to the high level before the time $T_{I8}$, the well is formed under the storing electrodes of the vertical picture element columns $R_1$, $R_2$ and $R_3$ ready for accepting the charges injected.

However, the picture element columns from the 8th column to the first, second and third columns $R_1$, $R_2$ and $R_3$, respectively, are considerably isolated and the injected charges disappear by recoupling until they reach the wells of said first, second and third picture element columns and never migrate into said wells. When attention is focused on the 9th and 10th picture element columns $R_9$ and $R_{10}$, respectively, the voltages applied to these picture element columns are at the high level and, obviously, wells are formed under the storing electrodes. Therefore, the charges injected into the substrate from the 8th picture element at the time $T_{I8}$ flow into the wells just under the storing electrodes formed by the 9th and 10th picture element columns $R_9$ and $R_{10}$, respectively. Instead, the injected charges which enter the well under the detecting electrode of the 11th picture element column $R_{11}$ at the time $T_{I8}$ in the readout mode are trapped at the wells of the 9th and 10th picture element columns, so that only a small amount remain and therefore there is no deterioration of the picture quality.

On the other hand, the injected charge of the 8th picture element column flows into the wells of the 9th and 10th picture element columns, but since readout of the charges of these wells has been completed, if the injected charge flows partly flows into the walls, they are injected again into the substrate at the times $T_{I9}$ and $T_{I10}$. As a result, cross-talk does not occur in the readout picture. Since the 11th picture element column $R_{11}$ is spatially isolated substantially from the vertical picture element column $R_8$ via the double well column, the injected charge is considered not to flow into the well of the 11th picture element column $R_{11}$ just formed at the time $T_{I8}$. More particularly, the influence of injected charges can be minimized by utilizing a charge holding period, corresponding to the two picture element column readout period in the FIG., which is longer than the time until the readout for the adjacent one. At least one picture element column then terminates between the readout period and the injection period.

Furthermore, in the 4th and 5th picture element columns, for example, the voltages of these picture elements come to the high level at the times $T_{I9}$ and $T_{I10}$ which are delayed from the time $T_{I8}$.

Additionally, the picture element columns $R_4$ and $R_5$ are also considerably isolated from the 8th picture element column. Such isolation of timing and distance causes the charges injected from the 8th picture element column to disappear due to re-coupling until they reach the wells generated at the times $T_{I9}$ and $T_{I10}$ of the 4th and 5th picture element columns $R_4$ and $R_5$, respectively. As a result these charges do not enter the wells, so that cross-talk does not result.

The phenomenon where injected charges migrate into the wells formed in the other picture element columns at the periphery of the picture element column where charges are injected can be prevented by providing the specified charge holding period $T_2$ between the readout period $T_1$ and the injection period $T_3$. As a result, the cross-talk of signal charges can be suppressed and the problem of deteriorating picture quality of the read out image can be eliminated.

The foregoing explanation is based on parallel readout for convenience of understanding. The invention is not particularly limited only to parallel readout and also provides excellent results with a series readout system.

As hereinbefore explained, the readout system for the CID of the invention assures a read out picture without cross-talk and provides great practical application results, because there is no fear of permitting the frame time to become longer.

While the invention has been described by means of a specific example and in a specific embodiment, we do not wish to be limited thereto, for obvious modifications will occur to those skilled in the art without departing from the spirit and scope of the invention.

We claim:

1. A method for driving a charge injection device having picture elements, each consisting of a storing electrode and a detecting electrode, arranged in the form of a matrix on a semiconductor substrate, the storing electrodes of the picture elements being connected in common for each column or row and the detecting electrodes being connected in common for each row or column, said charge injection device having a basic operation sequence essentially containing each operation of charge storing, readout and injection, said method comprising the steps of sequentially applying the basic operation sequence for each picture element which is considered as the readout unit with a constant time delay; and inserting the specified charge holding period between the readout period and the injection period.

2. A method for driving a charge injection device as claimed in claim 1, wherein said charge holding period is longer than the period required for completing readout operation of at least one adjacent readout unit picture element.

3. A method for driving a charge injection device as claimed in claim 1, wherein said charge holding period is provided at a potential well just under said storing electrode.

4. A method for driving a charge injection device as claimed in claim 1, wherein the picture element group which is the unit of the readout operation includes picture elements connected in common in a row or column.

5. A method for driving a charge injection device as claimed in claim 4, further comprising the steps of providing a column bus connecting the storing electrodes of each column in common, a row bus connecting the detecting electrodes of each row in common, connecting charge sensitive amplifiers corresponding to said row bus, sequentially applying voltage waveforms consisting of the storing mode, readout mode, charge holding mode and charge injection mode repeatedly to said column bus, and reading out the signal charges in the unit of the column direction picture element array in parallel.

6. A method for driving a charge injection device as claimed in claim 5, further comprising the step of periodically changing the operation voltage applied to said detecting electrodes through said row bus to high and low levels to cause the potential well just under the pertinent electrode to disappear prior to the start of the charge injection mode for each said column bus.

* * * * *